(12) United States Patent
Lee et al.

(10) Patent No.: US 11,899,863 B2
(45) Date of Patent: Feb. 13, 2024

(54) ORGANIC LIGHT EMITTING DIODE DISPLAY DEVICE INCLUDING TOUCH SENSOR AND MANUFACTURING METHOD OF SAME

(71) Applicant: LG Display Co., Ltd., Seoul (KR)

(72) Inventors: Jihun Lee, Paju-si (KR); Chulho Kim, Paju-si (KR); Namkook Kim, Paju-si (KR); Jungeun Lee, Paju-si (KR); Sungwoo Choi, Paju-si (KR); Hwankeon Lee, Paju-si (KR); Youngkyun Moon, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 17/116,595

(22) Filed: Dec. 9, 2020

(65) Prior Publication Data
US 2021/0200357 A1    Jul. 1, 2021

(30) Foreign Application Priority Data
Dec. 31, 2019    (KR) .......................... 10-2019-0180049

(51) Int. Cl.
*G06F 3/041*    (2006.01)
*G06F 3/044*    (2006.01)
(Continued)

(52) U.S. Cl.
CPC .......... *G06F 3/0412* (2013.01); *G06F 3/0446* (2019.05); *H10K 50/844* (2023.02);
(Continued)

(58) Field of Classification Search
USPC .......................................... 345/156, 170–178
See application file for complete search history.

(56) References Cited

U.S. PATENT DOCUMENTS

| 10,068,957 | B2 |   | 9/2018 | Kim et al. |
| 10,211,264 | B2 | * | 2/2019 | Lee ..................... H01L 27/3276 |

(Continued)

FOREIGN PATENT DOCUMENTS

| JP | 2014-56564 A | 3/2014 |
| JP | 2018-109962 A | 7/2018 |

(Continued)

*Primary Examiner* — Lin Li
(74) *Attorney, Agent, or Firm* — Birch, Stewart, Kolasch & Birch, LLP

(57) ABSTRACT

An organic light emitting diode display device including a touch sensor and a manufacturing method of the same are discussed. The display device includes a substrate having light emitting areas defined therein; light emitting elements provided on the light emitting areas on the substrate; a first encapsulation film covering the light emitting elements; color filters provided on the first encapsulation film to respectively correspond to the light emitting areas; bridge electrodes provided between the plurality of color filters on the first encapsulation film; a bank insulating film provided on the first encapsulation film to cover the bridge electrodes and surround the color filters; touch electrodes provided by being overlapped with the bridge electrodes on the bank insulating film; and a planarization film covering the color filters and the bank insulating film and exposing the touch electrodes.

20 Claims, 12 Drawing Sheets

(51) Int. Cl.

| | |
|---|---|
| *H10K 59/40* | (2023.01) |
| *H10K 71/00* | (2023.01) |
| *H10K 59/38* | (2023.01) |
| *H10K 50/844* | (2023.01) |
| *H10K 59/12* | (2023.01) |
| *H10K 50/15* | (2023.01) |

(52) U.S. Cl.
CPC ............. *H10K 59/12* (2023.02); *H10K 59/38* (2023.02); *H10K 59/40* (2023.02); *H10K 71/00* (2023.02); *G06F 2203/04103* (2013.01); *G06F 2203/04111* (2013.01); *H10K 59/1201* (2023.02)

(56) References Cited

U.S. PATENT DOCUMENTS

| | | | |
|---|---|---|---|
| 10,877,584 B2* | 12/2020 | Lee | G06F 3/0416 |
| 2016/0048238 A1 | 2/2016 | Qu | |
| 2017/0271610 A1* | 9/2017 | Takahashi | H10K 50/15 |
| 2018/0033979 A1* | 2/2018 | Jang | B32B 15/09 |
| 2018/0052552 A1* | 2/2018 | Tsai | H01L 27/323 |
| 2018/0095566 A1* | 4/2018 | Lee | H10K 59/40 |
| 2018/0123060 A1* | 5/2018 | Jang | H01L 51/0097 |
| 2018/0181240 A1* | 6/2018 | Heo | G06F 3/0412 |
| 2018/0182821 A1* | 6/2018 | Yun | G06F 3/0443 |
| 2018/0329552 A1* | 11/2018 | Song | G06F 3/0416 |
| 2019/0220126 A1 | 7/2019 | Heo et al. | |
| 2019/0377445 A1* | 12/2019 | Jeong | G06F 1/3262 |
| 2021/0132723 A1* | 5/2021 | Kim | G06F 3/04164 |
| 2021/0134893 A1* | 5/2021 | Lee | H01L 27/323 |
| 2021/0135166 A1* | 5/2021 | Baek | H01L 27/323 |
| 2021/0200357 A1* | 7/2021 | Lee | H01L 27/3244 |
| 2021/0200363 A1* | 7/2021 | Lee | H01L 27/322 |
| 2021/0200365 A1* | 7/2021 | Lee | G06F 3/0445 |

FOREIGN PATENT DOCUMENTS

| | | |
|---|---|---|
| JP | 2019-15845 A | 1/2019 |
| TW | 201814462 A | 4/2018 |
| TW | 201933606 A | 8/2019 |
| TW | 201937779 A | 9/2019 |
| WO | WO 2019/230328 A1 | 12/2019 |

* cited by examiner

ORGANIC LIGHT EMITTING DIODE DISPLAY DEVICE INCLUDING TOUCH SENSOR AND MANUFACTURING METHOD OF SAME

CROSS-REFERENCE TO RELATED APPLICATIONS

This application claims the priority benefit of Korean Patent Application No. 10-2019-0180049 filed on Dec. 31, 2019 in the Republic of Korea, the entire contents of which are hereby expressly incorporated herein by reference for all purposes as if fully set forth herein into the present application.

BACKGROUND OF THE INVENTION

Field of the Invention

The present disclosure relates to an organic light emitting diode display device including a touch sensor and a manufacturing method of the same.

Description of the Related Art

As information society evolves, various types of display devices have been developed. Lately, various display devices such as a liquid crystal display (LCD), a plasma display panel (PDP), and an organic light emitting display (OLED) have been utilized.

An organic light emitting element constituting the organic light emitting display is a self-luminous type, and does not require a separate light source, thereby reducing thickness and weight of the organic light emitting display. The organic light emitting display exhibits high quality properties such as low power consumption, high luminance, and high response speed.

Meanwhile, the organic light emitting display can include a touch display device implemented to receive a touch-based input method from a user. In such a touch display device, a capacitive touch sensing method, detecting the user's input by sensing a touch input on the basis of a change in capacitance formed in a touch electrode, has been widely used.

SUMMARY OF THE INVENTION

A technical problem to be solved or addressed by the present disclosure is to provide an organic light emitting diode display device in which a touch electrode and a color filter are mounted on a light emitting element.

Another technical problem to be solved or addressed by the present disclosure is to provide a manufacturing method of the organic light emitting diode display device in which the touch electrode and the color filter are mounted on the light emitting element.

The technical problems being addressed by the present disclosure are not limited to the above-mentioned technical problems, and other technical problems not described above, which will be clearly understood by those skilled in the art from the description of the claims, will be addressed by the present disclosure.

An organic light emitting diode display device including a touch sensor according to some exemplary embodiments of the present disclosure in order to address the technical problems and other limitations includes a substrate having a plurality of light emitting areas defined therein; a plurality of light emitting elements provided on the plurality of light emitting areas on the substrate; a first encapsulation film covering the plurality of light emitting elements; a plurality of color filters provided on the first encapsulation film to respectively correspond to the plurality of light emitting areas; a plurality of bridge electrodes provided between the plurality of color filters on the first encapsulation film; a bank insulating film provided on the first encapsulation film to cover the bridge electrodes and surround the plurality of color filters; a plurality of touch electrodes provided by being overlapped with the bridge electrodes on the bank insulating film; and a planarization film covering the plurality of color filters and the bank insulating film and exposing the plurality of touch electrodes, wherein at least one of the plurality of touch electrodes is connected to a touch line provided along a side surface of the planarization film.

In some of the exemplary embodiments of the present disclosure, the organic light emitting diode display device can further include a contact penetrating the bank insulating film and connecting the touch electrode and the bridge electrode vertically overlapped each other among the pluralities of touch electrodes and bridge electrodes.

In some of the exemplary embodiments of the present disclosure, the contact and the touch electrode can be integrally provided.

In some of the exemplary embodiments of the present disclosure, at least a part of the touch electrode can protrude onto the planarization film.

In some of the exemplary embodiments of the present disclosure, the part of the touch electrode can be extended onto the planarization film so as to be vertically overlapped with the color filter.

In some of the exemplary embodiments of the present disclosure, the bridge electrode and the color filter can be provided on a same plane.

In some of the exemplary embodiments of the present disclosure, the color filter and a part of the bridge electrode can be in contact with each other.

In some of the exemplary embodiments of the present disclosure, the first encapsulation film can include a first inorganic film, an organic film, and a second inorganic film sequentially provided on the plurality of light emitting elements.

A manufacturing method of a flexible display device according to some exemplary embodiments of the present disclosure in order to address the technical problems and other limitations includes providing a plurality of light emitting elements in a plurality of light emitting areas on a substrate; providing a first encapsulation film covering the plurality of light emitting elements; providing a bridge electrode on the first encapsulation film; providing a bank insulating film on the first encapsulation film, the bank insulating film exposing a part of the first encapsulation film, corresponding to the plurality of light emitting areas, and the bridge electrode; providing a plurality of color filters each on the first encapsulation film exposed by the bank insulating film; providing a planarization film to cover the plurality of color filters and the bank insulating film; providing a touch electrode on the bank insulating film to be vertically overlapped with the bridge electrode; and providing a second encapsulation film covering the touch electrode and the planarization film, wherein the providing of the touch electrode includes providing a touch line together along a side surface of the planarization film.

In some of the exemplary embodiments of the present disclosure, the providing of the touch electrode can include connecting the bridge electrode and the touch electrode to each other by providing a contact on the bridge electrode exposed by the bank insulating film and providing the touch electrode on the bank insulating film.

In some of the exemplary embodiments of the present disclosure, the providing of the plurality of color filters can include providing the plurality of color filters surrounded by the bank insulating film by injecting a pigment on the first encapsulation film exposed by the bank insulating film.

In some of the exemplary embodiments of the present disclosure, the providing of the planarization film can include applying a transparent organic material by an inkjet method so as to cover the bank insulating film and the color filter except an area where the touch electrode is provided.

In some of the exemplary embodiments of the present disclosure, the providing of the first encapsulation film can include sequentially providing a first inorganic film, an organic film, and a second inorganic film on the plurality of light emitting elements.

In an organic light emitting diode display device including a touch sensor according to exemplary embodiments of the present disclosure, a bridge electrode connecting between a plurality of touch electrodes is provided on the same plane together with a color filter in the structure of color filter on encapsulation layer (CoE) and touch on encapsulation layer (ToE). Accordingly, the thickness can be more reduced than that of the structure in which both the bridge electrode and the touch electrode are provided on the color filter, thereby obtaining an effect in which the thickness of the entire display device is reduced through the present disclosure.

In addition, as the touch electrode and the bridge electrode are disposed between light emitting areas, the touch electrode and the bridge electrode can function as a kind of a black matrix.

The effects and advantages of the present disclosure are not limited to the above-mentioned effects and advantages, and other effects and advantages not described above will be clearly understood by those skilled in the art from the description of the claims.

DETAILED DESCRIPTION OF THE EMBODIMENTS

Figure 1:
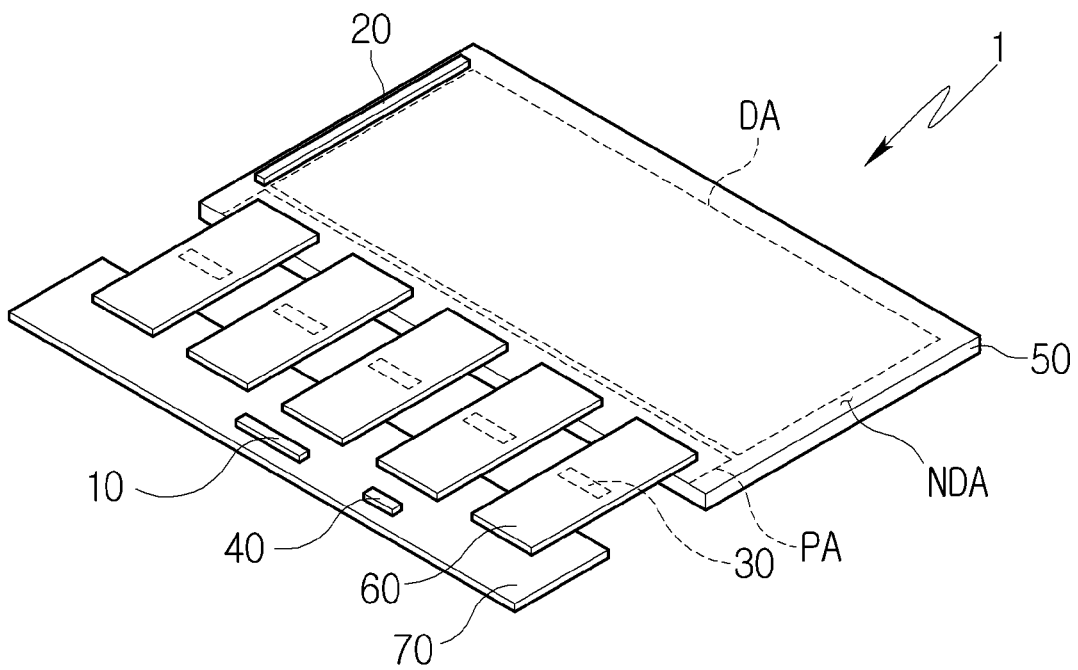
FIG. 1 is a perspective view of an organic light emitting diode display device including a touch sensor according to some exemplary embodiments of the present disclosure.

Hereinafter, various exemplary embodiments will be described with reference to the drawings. In this specification, when a first component (or area, layer, part, etc.) is referred to as being "on", "connected to", or "coupled with" a second component, it means that the first component can be directly connected to/coupled to the second component, or a third component can be disposed between the first and second components.

The same reference numerals refer to the same components. In addition, in the drawings, the thickness, proportion, and dimensions of the components are exaggerated for effective description of the technical content. "And/or" includes all combinations of one or more of which the associated configurations can be defined.

Although the terms "first", "second", etc. can be used herein to describe various components, these components should not be limited by these terms. These terms are only used for the purpose of distinguishing one element from another element and may not define order. For example, the first element can be referred to as a second element without departing from the scope of the various exemplary embodiments, and similarly, the second element can be referred to as a first element. As used herein, the singular forms are intended to include the plural forms as well, unless the context clearly indicates otherwise.

The terms "below", "on a lower side", "above", "on an upper side", etc. are used to describe the association of the components shown in the drawings. The terms are relative concepts and are explained based on the directions indicated in the drawings.

It will be further understood that the terms "comprise", "include", "have", etc. specify the presence of stated features, integers, steps, operations, elements, components, and/or combinations of them but do not preclude the presence or addition of one or more other features, integers, steps, operations, elements, components, and/or combinations thereof.

Figure 2:
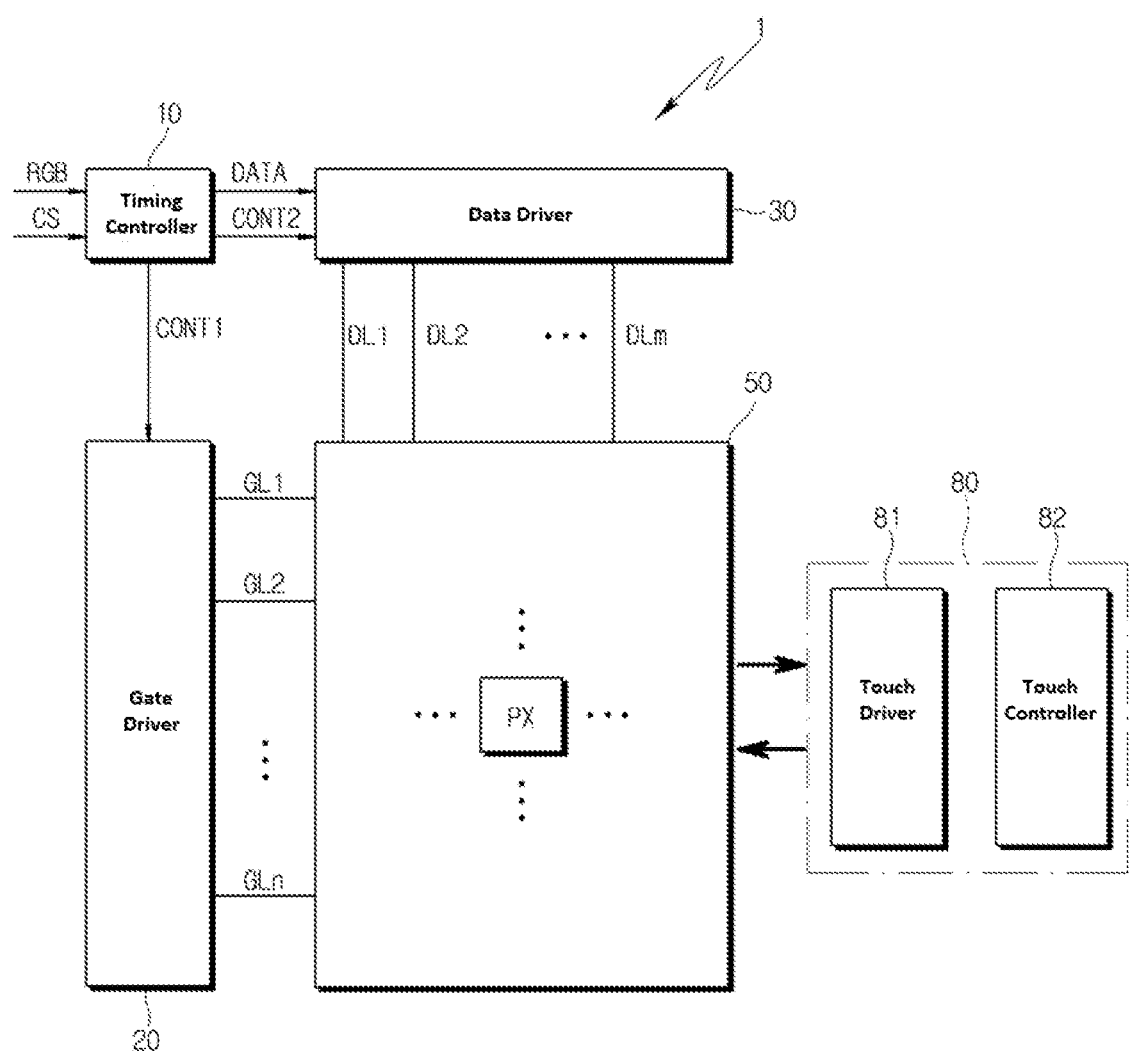
FIG. 2 is a block diagram of the organic light emitting diode display device including the touch sensor according to some of the exemplary embodiments of the present disclosure.

FIG. 1 is a perspective view of an organic light emitting diode display device including a touch sensor according to some exemplary embodiments of the present disclosure, and FIG. 2 is a block diagram of the organic light emitting diode display device including the touch sensor according to some of the exemplary embodiments of the present disclosure. All the components of the organic light emitting diode display device including the touch sensor according to all embodiments of the present disclosure are operatively coupled and configured.

Referring to FIGS. 1 and 2, an organic light emitting diode display device including the touch sensor 1 according to some of the exemplary embodiments of the present disclosure can include a timing controller 10, a gate driver 20, a data driver 30, and a power supply unit 40, a display panel 50, a touch circuit part 80, etc.

The timing controller 10 can receive an image signal RGB and a control signal CS from the outside. The image signal RGB can include a plurality of gray scale data. The control signal CS can include, for example, a horizontal synchronization signal, a vertical synchronization signal, and a main clock signal.

The timing controller 10 processes the image signal RGB and the control signal CS to be suitable for operating conditions of the display panel 50, thereby generating and outputting image data, a gate drive control signal CONT1, and a data drive control signal CONT2.

The gate driver 20 can be connected to pixels PX of the display panel 50 through a plurality of gate lines GL1 to GLn. The gate driver 20 can generate gate signals on the basis of the gate drive control signal CONT1 output from the timing controller 10. The gate driver 20 can provide the generated gate signals to the pixels PX through the plurality of gate lines GL1 to GLn, where n is a positive number such as a positive integer.

The data driver 30 can be connected to the pixels PX of the display panel 50 through a plurality of data lines DL1 to DLm, where m is a positive number such as a positive integer. The data driver 30 can generate data signals on the basis of the image data and the data drive control signal CONT2 output from the timing controller 10. The data driver 30 can provide the generated data signals to the pixels PX through the plurality of data lines DL1 to DLm.

The timing controller 10, the gate driver 20, the data driver 30, and the power supply unit 40 can be each composed of a separate integrated circuit (IC) or an integrated circuit in which at least a part thereof is combined. For example, at least one of the data driver 30 and the power supply unit 40 can be composed of the integrated circuit combined with the timing controller 10.

The display panel 50 includes a display area DA and a non-display area NDA. The display area DA is an area where the pixels PX are disposed, and can be referred to as an active area. The non-display area NDA can be disposed around the display area DA. For example, the non-display area NDA can be disposed along the edge of the display area DA. The non-display area NDA can be comprehensively referred to as areas other than the display area DA on the display panel 50, and can be referred to as a non-active area.

In the non-display area NDA, for example, a gate driver 20 can be provided as a driver for driving the pixels PX. In the non-display area NDA, the gate driver 20 can be disposed adjacent to one side or both sides of the display area DA. As shown in FIG. 1, the gate driver 20 can be provided in the non-display area NDA of the display panel 50 by the gate in panel method. However, in another exemplary embodiment, the gate driver 20 is made of a driving chip and mounted on a flexible film and the like, and can be attached to the non-display area NDA by a tape automated bonding (TAB) method.

A pad area (PA) can be defined in the non-display area NDA. A plurality of pads can be provided in the pad area PA. The pads are not covered by an insulating layer, and are exposed outside the display panel 50 to be electrically connected to the data driver 30, a circuit board 70, etc.

The display panel 50 can include wirings for supplying electrical signals to the pixels PX. The wirings can include, for example, the gate lines GL1 to GLn, the data lines DL1 to DLm, and power lines PL1 and PL2.

A plurality of pixels PX (or referred to as sub-pixels) is disposed on the display panel 50. The pixels PX can be disposed in a matrix form on the display panel 50, for example.

Each pixel PX can be electrically connected to a corresponding gate line and data line. These pixels PX can emit light with luminance corresponding to the gate signals and the data signals, which are respectively supplied through the gate lines GL1 to GLn and the data lines DL1 to DLm.

Each pixel PX can display any one of the first to third colors. In the exemplary embodiment, each pixel PX can display any one of red, green, and blue colors. In another exemplary embodiment, each pixel PX can display any one of cyan, magenta, and yellow colors. In various exemplary embodiments, the pixels PXs can be configured to display any one of four or more colors. For example, each pixel PX can also display any one of red, green, blue, and white colors.

First and second touch electrodes can be provided on the display panel 50. The first touch electrodes can be provided to cross with the second touch electrodes. Touch sensors can be provided at each of crossing parts of the first touch electrodes and the second touch electrodes. Hereinafter, the touch sensors implemented in the exemplary embodiments of the present disclosure have been described as being implemented by a mutual capacitance method, but this is an example, and the present disclosure is not limited thereto. A detailed description of the first and second touch electrodes will be described later with reference to FIG. 4.

A flexible film 60 can have one end thereof attached to the pad area PA of the display panel 50 and the other end thereof attached to the circuit board 70, thereby electrically connecting the display panel 50 and the circuit board 70 to each other. The flexible film 60 can include a plurality of wirings for electrically connecting the pads provided in the pad area PA and wirings of the circuit board 70 to each other. In the exemplary embodiment, the flexible film 60 can be attached on the pads through an anisotropic conducting film (ACF).

When the data driver 30 is made of the driving chip, the data driver 30 can be mounted on the flexible film 60 in the chip on film (COF) or chip on plastic (COP) method. The data driver 30 can generate a data signal on the basis of the image data and the data drive control signal CONT2, which are received from the timing controller 10, and can output the data signal to the data lines DL1 to DLm through the connected pads.

A plurality of circuits implemented with the driving chips can be mounted on the circuit board 70. The circuit board 70 can be a printed circuit board or a flexible printed circuit board, but the type of the circuit board 70 is not limited thereto.

Figure 3:
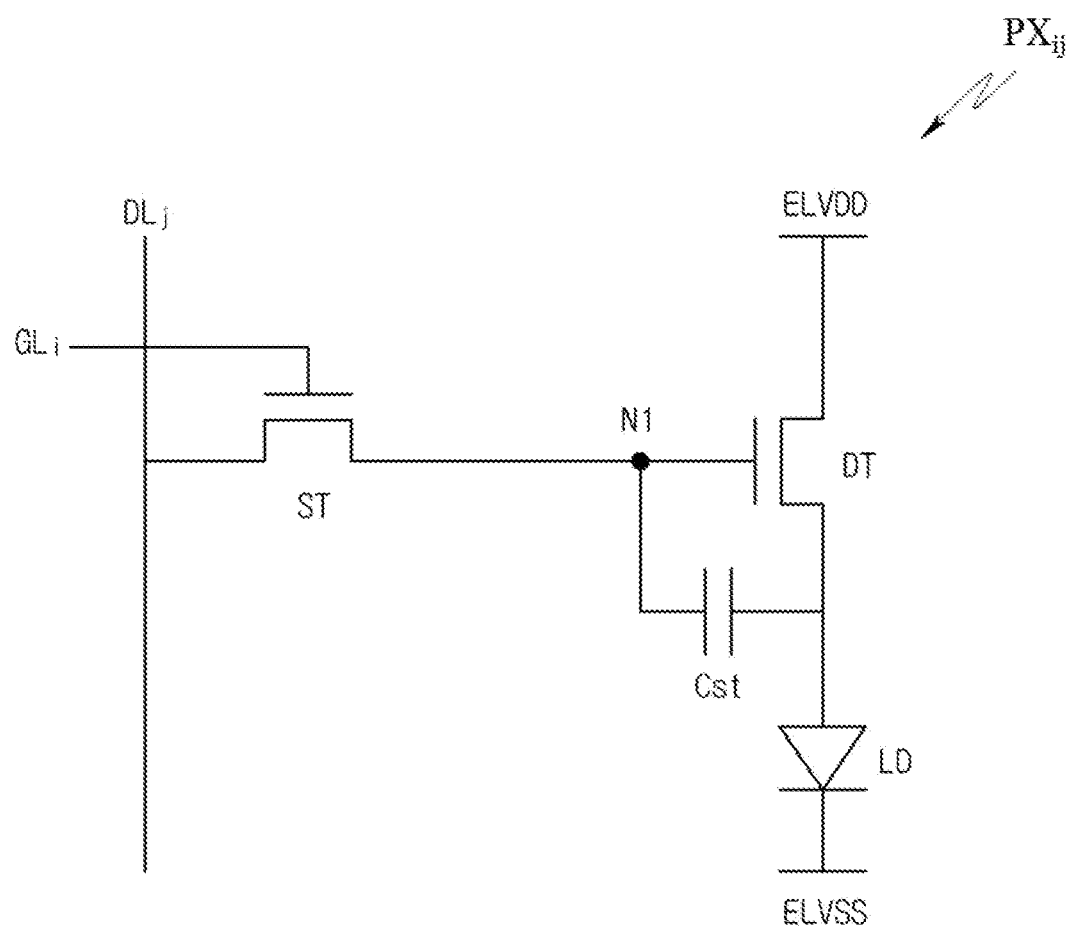
FIG. 3 is a circuit diagram showing some of the exemplary embodiments of a pixel shown in FIG. 2.

The circuit board 70 can include the timing controller 10 and the power supply unit 40 mounted in the form of the integrated circuit. In FIG. 3, the timing controller 10 and the power supply unit 40 are shown as separate components, but the present exemplary embodiments are not limited thereto. That is, in the various exemplary embodiments, the power supply unit 40 can be integrally provided with the timing controller 10 or the timing controller 10 can be configured to perform the function of the power supply unit 40.

The touch circuit part 80 can include a touch driver 81 and a touch controller 82. The touch circuit part 80 supplies driving pulses for scanning a touch signal to the display panel 50 through touch lines connected to the display panel 50 in order to implement a touch operation of the display panel 50, and can sense the charge variation amount of each of the touch sensors to sense touch presence and/or touch coordinates.

Specifically, the touch driver 81 supplies the driving pulse for scanning the touch signal to the display panel 50, and can sense the charge variation amount of each of the touch sensors.

The touch controller 82 can generate a touch line selection signal for receiving the charge variation amount when the driving pulse is output from the touch driver 81. The touch controller 82 can generate timing control signals for controlling operation timing of the touch driver 81. In addition, the touch controller 82 can receive the charge variation amount of the touch sensors from the touch driver 81 to calculate touch coordinates to provide information about the touch coordinates to a host system.

The touch circuit part 80 can be implemented by one or more components, for example, the integrated circuit, or can be implemented separately from the driving circuit of the display device 1. Alternatively, all or part of the touch circuit part 80 can be integrated with one or more of the driving circuit of the display device 1 or an internal circuit thereof.

FIG. 3 is a circuit diagram showing some of the exemplary embodiments of the pixel PX shown in FIG. 2. FIG. 3 shows an example of a pixel PXij connected to an i-th gate line GLi and a j-th data line DLj.

Referring to FIG. 3, the pixel PX includes a switching transistor ST, a driving transistor DT, a storage capacitor Cst, and a light emitting element LD.

A first electrode (for example, a source electrode) of the switching transistor ST is electrically connected to the j-th data line DLj, and a second electrode (for example, a drain electrode) is electrically connected to a first node N1. The gate electrode of the switching transistor ST is electrically connected to the i-th gate line GLi. The switching transistor ST is turned on when a gate-on level gate signal is applied to the i-th gate line GLi, and transmits a data signal applied to the j-th data line DLj to the first node N1.

The first electrode of the storage capacitor Cst is electrically connected to the first node N1, and the second electrode can be connected to an anode electrode of the light emitting element LD. Depending on the data voltage stored in the storage capacitor Cst, the driving transistor DT operates to allow a driving current to flow between the high potential driving voltage ELVDD and the low potential driving voltage ELVSS.

A first electrode (for example, a source electrode) of the driving transistor DT is configured to receive the high potential driving voltage ELVDD, and a second electrode (for example, a drain electrode) thereof is electrically connected to the first electrode of the light emitting element LD (for example, the anode electrode). The gate electrode of the driving transistor DT is electrically connected to the first node N1. The driving transistor DT is turned on when the voltage of the gate-on level is applied through the first node N1, and can control the amount of the driving current flowing through the light emitting element LD in response to the voltage provided to the gate electrode.

The light emitting element LD outputs light corresponding to the driving current. The light emitting element LD can output the light corresponding to any one of red, green, and blue colors. The light emitting element LD can be an organic light emitting diode (OLED), or an ultra-small inorganic light emitting diode having a size ranging from micro to nanoscale, but the present disclosure is not limited thereto. Hereinafter, an exemplary embodiment in which the light emitting element LD is composed of an organic light emitting diode will be described.

In the various exemplary embodiments of the present disclosure, the structure of the pixels PX is not limited to that shown in FIG. 3. According to the exemplary embodiment, the pixels PX can compensate for a threshold voltage of the driving transistor DT, or can further include at least one element for initializing the voltage of the gate electrode of the driving transistor DT and/or the voltage of the anode electrode of the light emitting element LD.

FIG. 3 shows an example in which the switching transistor ST and the driving transistor DT are NMOS transistors, but the present disclosure is not limited thereto. For example, at least some or all of the transistors constituting each pixel PX can be composed of PMOS transistors.

In some of the exemplary embodiments of the present disclosure, each of the switching transistor ST and the driving transistor DT can be implemented with a low temperature polysilicon (LTPS) thin film transistor, an oxide thin film transistor, or a low temperature polycrystalline oxide (LTPO) thin film transistor.

Figure 4:
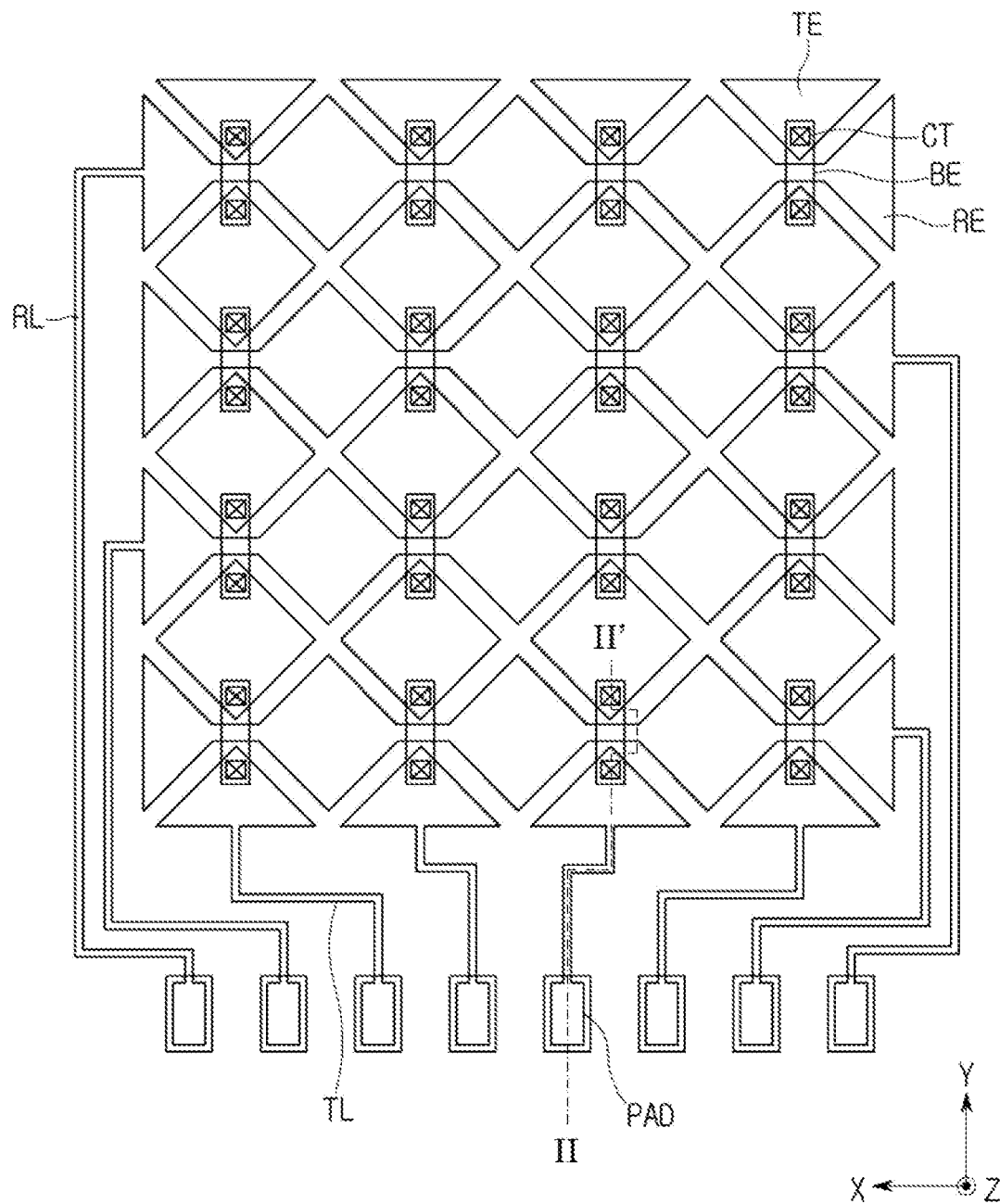
FIG. 4 is a plan view showing the touch sensor of the organic light emitting diode display device including the touch sensor according to some of the exemplary embodiments of the present disclosure.

FIG. 4 is a plan view showing the touch sensor of the organic light emitting diode display device including the touch sensor according to some of the exemplary embodiments of the present disclosure.

Referring to FIG. 4, the organic light emitting diode display device including the touch sensor according to some of the exemplary embodiments of the present disclosure can include a first touch electrode TE arranged in parallel with the first direction Y and a second touch electrode RE arranged in parallel with the second direction X.

A mutual capacitance corresponding to the touch sensor can be provided at a crossing part of the first touch electrode TE and the second touch electrode RE.

The first touch electrode TE disposed on an edge of the first touch electrodes TE connected to each other in the first direction Y can be connected to a first touch line TL. The first touch line TL is connected to the touch driver 81 through the pad PAD positioned in the non-display area NDA, and the first touch electrodes TE can receive the driving pulse from the touch driver 81 through the first touch line TL.

The second touch electrodes RE disposed on the edge of the second touch electrodes RE connected to each other in the second direction X can be connected to a second touch line RL. The second touch line RL is connected to the touch driver 81 through the pad PAD, and the second touch electrodes RE can receive an input of the driving pulse from the touch driver 81 through the first touch line TL.

The first touch electrodes TE arranged in parallel with the first direction Y can be connected to each other through a bridge electrode BE. More specifically, the first touch electrodes TE can be connected to the bridge electrode BE through a contact hole CH.

Figure 5:
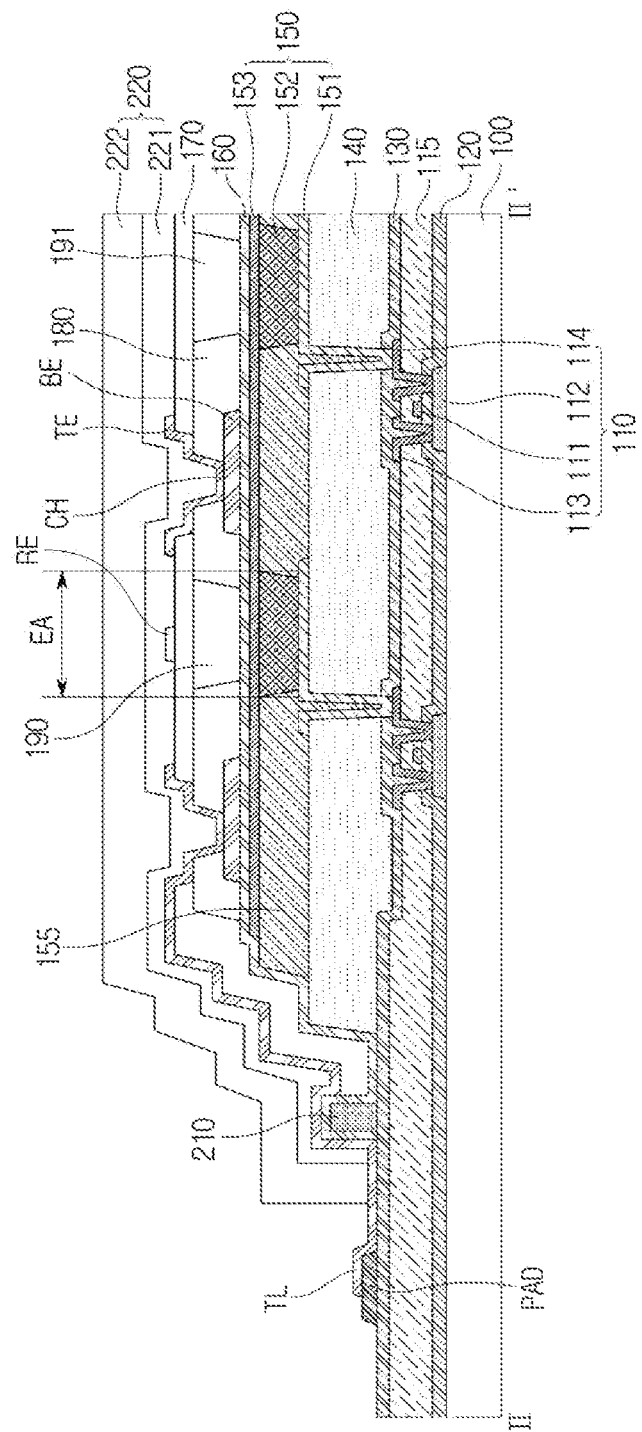
FIG. 5 is a pixel structure of the organic light emitting diode display device including the touch sensor according to some of the exemplary embodiments of the present disclosure, shown by cutting along line II-II' of FIG. 4.

FIG. 5 is a pixel structure of the organic light emitting diode display device including the touch sensor according to some of the exemplary embodiments of the present disclosure, shown by cutting along the line II-II' of FIG. 4.

Referring to FIG. 5, the organic light emitting diode display device including the touch sensor according to some of the exemplary embodiments of the present disclosure can include a substrate 100, a transistor 110, a gate insulating film 120, a passivation film 130, an overcoat film 140, a light emitting element 150, a first bank insulating film 155, a first encapsulation film 160, a planarization film 170, a second bank insulating film 180, a color filter 190, and a second encapsulation film 220.

The substrate 100 can be a translucent substrate, as a base material of the display panel 50. The substrate 100 can be a rigid substrate including glass or tempered glass, or a flexible substrate made of plastic. For example, the substrate 100 can be formed of plastic materials such as polyimide (PI), polyethylene terephthalate (PET), polyethylene naphthalate (PEN), and polycarbonate (PC). However, the present disclosure is not limited thereto.

The circuit element layer is formed on the substrate 100, and can include circuit elements (for example, a transistor 110, a capacitor, etc.) and wirings constituting the pixel PX.

In some of the exemplary embodiments, a light blocking layer blocking external light or a buffer layer blocking impurities and moisture from the substrate can be further formed between the substrate 100 and the transistor 110.

The transistor 110 can be provided on the substrate 100. The transistor 110 can include a gate electrode 111, an active pattern 112, a source electrode 113 and a drain electrode 114.

The gate electrode 111 can be disposed to correspond to a part where the channel of the active pattern 112 is provided. The gate electrode 111 is formed of any one or alloys thereof selected from a group consisting of molybdenum (Mo), aluminum (Al), chromium (Cr), gold (Au), titanium (Ti), nickel (Ni), neodymium (Nd), and copper (Cu). In addition, the gate electrode 111 can be multi-layered films made of any one or alloys thereof selected from the group consisting of molybdenum (Mo), aluminum (Al), chromium (Cr), gold (Au), titanium (Ti), nickel (Ni), neodymium (Nd), and copper (Cu). For example, the gate electrode 111 can be a double layer of molybdenum/aluminum-neodymium or molybdenum/aluminum.

The active pattern 112 can be formed of a silicon-based semiconductor material or an oxide-based semiconductor material. Amorphous silicon or polycrystalline silicon can be used as the silicon-based semiconductor material. The following materials can be used as the oxide semiconductor material, including: indium tin gallium zinc oxide (InSn-GaZnO) which is a quaternary metal oxide, indium gallium zinc oxide (InGaZnO) which is a ternary metal oxide, indium tin zinc oxide (InSnZnO), indium aluminum zinc oxide (InAlZnO), tin Gallium zinc oxide (SnGaZnO), aluminum gallium zinc oxide (AlGaZnO), tin aluminum zinc oxide (SnAlZnO), binary metal oxide indium zinc oxide (InZnO), tin zinc oxide (SnZnO), aluminum zinc oxide (AlZnO), zinc Magnesium oxide (ZnMgO), tin magnesium oxide (SnMgO), indium magnesium oxide (InMgO), indium gallium oxide (InGaO), indium oxide (InO), tin oxide (SnO), and zinc oxide (ZnO).

The gate insulating film 120 can be formed between the gate electrode 111 and the active pattern 112. The gate insulating film 120 can be silicon oxide (SiOx), silicon nitride (SiNx), or multi-layered films thereof. Unlike that shown in FIG. 5, the gate insulating film 120 can be formed only in an area where the gate electrode 111 and the active pattern 112 are overlapped without covering the entire surface of the substrate 100.

An interlayer insulating film 115 can be formed on the gate insulating film 120. The interlayer insulating film 115 can be formed to cover the gate insulating film 120, the active pattern 112, the gate electrode 111, etc. The interlayer insulating film 115 can be a silicon oxide film (SiOx), a silicon nitride film (SiNx), or multi-layered films thereof.

In the various exemplary embodiments, the interlayer insulating film 115 can be formed of multi-layered films, and conductive films can be further provided between the interlayer insulating films of the multi-layered films. The conductive films formed between the interlayer insulating films ILD can further include, for example, electrodes of circuit elements such as an auxiliary gate electrode of the transistor 110 and an upper electrode of the storage capacitor Cst, and driving lines.

The source electrode 113 and the drain electrode 114 can be provided to be connected to the active pattern 112. The source electrode 113 and the drain electrode 114 are disposed by being spaced apart at a predetermined interval on the interlayer insulating film 115. The source electrode 113 and the drain electrode 114 can be respectively connected to the source area and the drain area of the active pattern 112 through contact holes penetrating the interlayer insulating film 115.

The source electrode 113 and the drain electrode 114 can be formed of a single film or multiple films made of any one or alloys of molybdenum (Mo), aluminum (Al), chromium (Cr), gold (Au), titanium (Ti), nickel (Ni), neodymium (Nd), and copper (Cu). When the source electrode 113 and the drain electrode 114 are multi-layered films, the electrodes can be made of a double layer of molybdenum/aluminum-neodymium, or a triple layer of titanium/aluminum/titanium, molybdenum/aluminum/molybdenum, and molybdenum/aluminum-neodymium/molybdenum.

The source electrode 113, the drain electrode 114, the gate electrode 112, and the active pattern 210 corresponding thereto can constitute the transistor T. The transistor 110 can be, for example, a driving transistor DT or a switching transistor ST. In FIG. 5, the driving transistor DT in which the drain electrode 114 is connected to a first electrode 151 of the light emitting element 150 is shown as an example.

The passivation film 130 can be formed on the interlayer insulating film 115. The passivation film 130 can be formed to cover the interlayer insulating film 115, the source electrode 113, and the drain electrode 114.

The passivation film 130 can be an insulating film for protecting the transistor 110. The passivation film 130 can be, for example, a silicon oxide film (SiOx), a silicon nitride film (SiNx), or multiple films thereof, but the present disclosure is not limited thereto.

The overcoat film 140 can be formed on the passivation film 130. The overcoat film 140 can be a planarization film for alleviating the step difference of an underlying structure due to, in particular, the transistor 110 and the like. The overcoat film 140 can be made of, for example, organic materials such as polyimide, benzocyclobutene series resin, acrylate, etc., but the present disclosure is not limited thereto.

The first bank insulating film 155 can be formed on the overcoat film 140. The first bank insulating film 155 can be a pixel defining film that defines a light emitting area EA of the pixel PX. As shown in FIG. 4, the first bank insulating film 155 can define a plurality of light emitting areas EA exposing a plurality of first electrodes 151 provided on the substrate 100.

The first bank insulating film 155 can be formed to expose an area part of the first electrode 151, for example, a central part, but cover the remaining area, for example, an edge part. It can be preferable to design the area of the exposed first electrode 151 to have the maximum value possible to secure a sufficient aperture ratio. The exposed area of the first electrode 151 not covered by the first bank insulating film 155 can be defined as the light emitting area EA of the pixel PX. In the light emitting area EA, the first electrode 151, the light emitting layer 152, and the second electrode 153 can be stacked to be in direct contact.

The first bank insulating film 155 can be formed of an organic film such as an acrylic resin, an epoxy resin, a phenolic resin, a polyamide resin, or a polyimide resin.

The light emitting element 150 can be formed on the overcoat film 140. The light emitting element 150 can include the first electrode 151, the light emitting layer 152 and the second electrode 153. In some of the exemplary embodiments of the present disclosure, the first electrode 151 can be an anode electrode and the second electrode 153 can be a cathode electrode.

At least one of the first electrode 151 and the second electrode 153 can be a transmissive electrode and at least the other thereof can be a reflective electrode. For example, as shown in FIG. 5, when the light emitting element 150 is a top emission type, the first electrode 151 can be the reflective electrode, and the second electrode 153 can be the transmissive electrode.

The first electrode 151 can be provided on the overcoat film 140. The first electrode 151 can be connected to the drain electrode 114 of the transistor 110 through a via hole penetrating the overcoat film 140 and the passivation film 130.

The first electrode 151 can be composed of a transparent conductive material such as Indium Tin Oxide (ITO), Indium Zinc Oxide (IZO), or Zinc Oxide (ZnO). When the first electrode 151 is the reflective electrode, the first electrode 151 can include a reflective layer. The reflective layer can be made of aluminum (Al), copper (Cu), silver (Ag), nickel (Ni), or alloys thereof. In the exemplary embodiment, the reflective layer can be composed of APC (silver/palladium/copper alloy).

A light emitting layer 152 can be formed between the first electrode 151 and the second electrode 153. Specifically, the light emitting layer 152 can be formed so that the first bank insulating film 155 fills a trench formed in the light emitting area EA.

The light emitting layer 152 can have a multi-layered thin film structure including a light generation layer. For example, the light emitting layer 152 can include a hole transport layer (HTL), an organic light emitting layer, and an electron transport layer (ETL). The hole transport layer serves to smoothly transport holes injected from the first electrode 151 to the organic light emitting layer. The organic light emitting layer can be formed of an organic material including phosphorescent or fluorescent materials. The electron transport layer serves to smoothly transfer electrons injected from the second electrode 153 to the organic light emitting layer. In addition to the hole transport layer, the organic light emitting layer, and the electron transport layer, the light emitting layer 152 can further include a hole injection layer (HIL), a hole blocking layer (HBL), an electron injection layer (EIL), and an electron blocking layer (EBL).

The light emitting layer 152 can be formed of a tandem structure of two or more stacks. In this case, each of the stacks can include the hole transport layer, the organic light emitting layer, and the electron transport layer. When the light emitting layer 152 is formed in the tandem structure of two or more stacks, a charge generation layer can be formed between the stacks. The charge generation layer can include an n-type charge generation layer positioned adjacent to a lower stack and a p-type charge generation layer formed on the n-type charge generation layer to be positioned adjacent to an upper stack. The n-type charge generation layer injects electrons into the lower stack, and the p-type charge generation layer injects holes into the upper stack. The n-type charge generation layer can be an organic layer in which an alkali metal such as lithium (Li), sodium (Na), potassium (K), or cesium (Cs); or an alkaline earth metal such as magnesium (Mg), strontium (Sr), barium (Ba), or radium (Ra), is doped with an organic host material having electron transport capability. The p-type charge generation layer can be the organic layer doped with a dopant in an organic host material having the hole transport capability.

The color of light generated in the light generation layer can be white, but the present disclosure is not limited thereto. For example, the color of light generated in the light generation layer of the light emitting layer 152 can be any one of red, green, magenta, cyan, and yellow.

In some of the exemplary embodiments of the present disclosure, the light emitting layer 152 may not only be formed in the light emitting area EA, but can also be extended to cover the upper surface of the first bank insulating film 155 and the upper surface of the overcoat layer OC.

The second electrode 153 is provided on the light emitting layer 152. The second electrode 153 can be provided to cover the light emitting layer 152. The second electrode 153 can be formed of a transparent metal material (TCO) that can transmit light, or can be formed of a semi-transmissive conductive material such as molybdenum (Mo), tungsten (W), silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), and alloys thereof. When the second electrode 153 is made of the semi-transmissive metal material, light emission efficiency can be increased by a micro cavity.

A first encapsulation film 160 can be formed on the second electrode 153. The first encapsulation film 160 can prevent oxygen or moisture from penetrating the light emitting element 150. In some of the exemplary embodiments of the present disclosure, the first encapsulation film 160 can include at least one inorganic film. More specifically, the first encapsulation film 160 can be formed of at least one of silicon nitride, aluminum nitride, zirconium nitride, titanium nitride, hafnium nitride, tantalum nitride, silicon oxide, aluminum oxide, and titanium oxide.

The first encapsulation film 160 can be extended to cover the side surfaces of the first bank insulating film 155 and the overcoat film 140, and to cover the upper surfaces of the passivation film 130 and a dam 210.

The bridge electrode BE, the contact hole CH, the touch electrode TE, the second bank insulating film 180, and the color filter 190 can be formed on the first encapsulation film 160.

The color filter 190 can be formed on the first encapsulation film 160 to correspond to the light emitting element 150. Therefore, a plurality of color filters 190 can be formed on the first encapsulation film 160 to correspond to the light emitting area EA defined on the substrate 100. The color filter 190 can be surrounded by the second bank insulating film 180.

The color filter 190 transmits light emitted from the light emitting element 150, and can selectively transmit any one of red light, green light, and blue light, for example.

The color filter 190 can be formed by filling pigment into a trench defined by a side wall of the second bank insulating film 180 and an upper surface of the first encapsulation film 160.

Specifically, the color filter 190 can be formed by filling the trench with any one of red, green, or blue pigments by the inkjet method and curing the pigment. Alternatively, the color filter 190 can be formed by filling the trench with a transparent organic material by the inkjet method and curing the material in order to provide a white sub-pixel. The plurality of color filters 190 and 191 adjacent to each other shown in FIG. 5 can be the color filters formed by the same inkjet method.

The bridge electrode BE can be provided on the first encapsulation film 160. The bridge electrode BE can be provided on the first encapsulation film 160 between the plurality of color filters 190 and 191. The bridge electrode BE and the color filter 190 can be provided on the same plane. The bridge electrode BE can connect between the touch electrodes TE arranged in parallel with the first direction (i.e., Y direction in FIG. 4).

The bridge electrode BE can include, for example, a transparent conductive film such as ITO or IZO, but the present disclosure is not limited thereto. Alternatively, the bridge electrode BE can include at least one material of Ti, Al, Mo, MoTi, Cu, and Ta.

As shown in FIG. 5, the bridge electrode BE may not be overlapped with the light emitting area EA. That is, the bridge electrode BE may not be overlapped vertically with the light emitting element 150. Therefore, the aperture ratio of the light emitting element 150 may not be affected by the bridge electrode BE.

The contact hole CH can connect between the bridge electrode BE and the touch electrode TE. The contact hole CH can be formed by passing through the second bank insulating film 180. As described later, the contact hole CH can be formed integrally with the touch electrode TE.

The second bank insulating film 180 can be formed on the first encapsulation film 160 to surround the color filter 190. That is, the second bank insulating film 180 can be formed to partition the plurality of color filters 190 provided on the first encapsulation film 160. That is, a trench surrounded by the second bank insulating film 180 is formed, and the color filter CF can be formed in the trench. The trench formed by the second bank insulating film 180 can be aligned with the light emitting area EA to be overlapped vertically.

The second bank insulating film 180 can expose a part of the upper surface of the bridge electrode BE. The upper surface of the bridge electrode BE exposed by the second bank insulating film 180 can be in contact with the contact hole CH.

In addition, the second bank insulating film 180 can surround the bridge electrode BE and the contact hole CH. That is, an interval between a plurality of electrodes BE or a plurality of contacts CT, adjacent to each other by the second bank insulating film 180, can be insulated.

The second bank insulating film 180 can be formed of, for example, an organic film such as acrylic resin, epoxy resin, phenolic resin, polyamide resin, polyimide resin, etc., but the present disclosure is not limited thereto.

As shown in FIG. 5, a contact surface between the second bank insulating film 180 and the color filter 190 can have a tapered shape. However, the present disclosure is not limited thereto, and the contact surface can have a rectangular or reverse tapered shape.

The planarization film 170 can be formed to cover the second bank insulating film 180. The planarization film 170 can cover not only the upper surface of the second bank insulating film 180 but also the side surface of the first encapsulation film 160. The planarization film 170 can be blocked so as not to cover the pad PAD area by the dam 210 formed on the passivation film 130.

The planarization film 170 can cover the light emitting area EA in which the light emitting element 150 is provided. Therefore, the planarization film 170 can include a transparent organic material or a transparent inorganic material, which have high transmittance to transmit light.

In the process of forming the planarization film 170, the planarization film 170 can be formed by applying a liquid organic material or a liquid inorganic material on the second bank insulating film 180 by the inkjet method. At this time, the planarization film 170 can be formed to expose a part of the upper surface of the bridge electrode BE so that the contact hole CH and the touch electrode can be formed flat.

In FIG. 5, the dam 210 is shown as having a single dam structure, but the present disclosure is not limited thereto.

The dam 210 can include two or more structures formed on the passivation film 130 by being spaced apart at a predetermined distance.

A first touch electrode TE can be provided on the second bank insulating film 180. The first touch electrode TE can be provided to be vertically overlapped with the bridge electrode BE. The first touch electrode TE can be connected through the bridge electrode BE and the contact hole CH. As described later, the first touch electrode TE can be integrally provided with the contact hole CH. That is, the first touch electrode TE can be provided in the same process as that of the contact hole CH.

The first touch electrode TE can be extended onto the planarization film 170. That is, at least a part of the first touch electrode TE can be provided to protrude onto the planarization film 170.

In addition, together with the bridge electrode BE, the first touch electrode TE can be disposed between the color electrodes 190 and 191. That is, the first touch electrode TE and the bridge electrode BE can be disposed between the light emitting area EA defined in the substrate 100.

As described above, when the color filter 190 is formed in the inkjet method, since the color filter 190 has a thickness of about 2 to 3 μm, it is necessary to effectively prevent color mixing between sub-pixels. In the display device according to the exemplary embodiment of the present disclosure, as the first touch electrode TE and the bridge electrode BE are disposed between the light emitting areas EA, the first touch electrode TE and the bridge electrode BE are able to function as a kind of a black matrix.

The first touch electrode TE can be extended onto the planarization film 170 covering the side surface of the first encapsulation film 160. That is, the first touch electrode TE can be extended onto the side surface of the planarization film 170. The first touch electrode TE extended to the side surface of the planarization film 170 can form a touch line TL. The touch line TL can be extended onto the non-display area NDA beyond the dam 210, so as to be connected to the pad PAD.

A second encapsulation film 220 can be formed to cover the touch electrode TE and the planarization film 170. In the exemplary embodiment shown in FIG. 5, the second encapsulation film 220 can include an inorganic film 221 and an organic film 222.

The inorganic film 221 can include, for example, at least one of silicon nitride, aluminum nitride, zirconium nitride, titanium nitride, hafnium nitride, tantalum nitride, silicon oxide, aluminum oxide, and titanium oxide, but the present disclosure is limited thereto.

The organic film 222 can include, for example, acrylic resin, epoxy resin, phenolic resin, polyamide resin, polyimide resin, and the like, but the present disclosure is not limited thereto.

As shown in FIG. 5, the second encapsulation film 220 can expose a part of the pad PAD and the touch line TL. However, this is an example, and the second encapsulation film 220 can be formed to cover the pad PAD.

A polarizing film and an OLED transmittance controllable film (OTF) and the like can be further formed on the second encapsulation film 220.

The organic light emitting diode display device including the touch sensor according to the exemplary embodiment of the present disclosure includes a structure of a color filter on encapsulation layer (CoE) and a touch on encapsulation layer (ToE), in which the color filter 190 and the touch electrode TE are provided on the first encapsulation film 160.

In the ToE structure, the bridge electrode BE connecting between the plurality of touch electrodes is provided on the same planes on the color filter 190 and the first encapsulation film 160. Accordingly, the thickness can be more reduced than that of the structure in which both the bridge electrode and the touch electrode are provided on the color filter, thereby obtaining an effect in which the thickness of the entire display device is reduced through the ToE structure.

Figure 6:
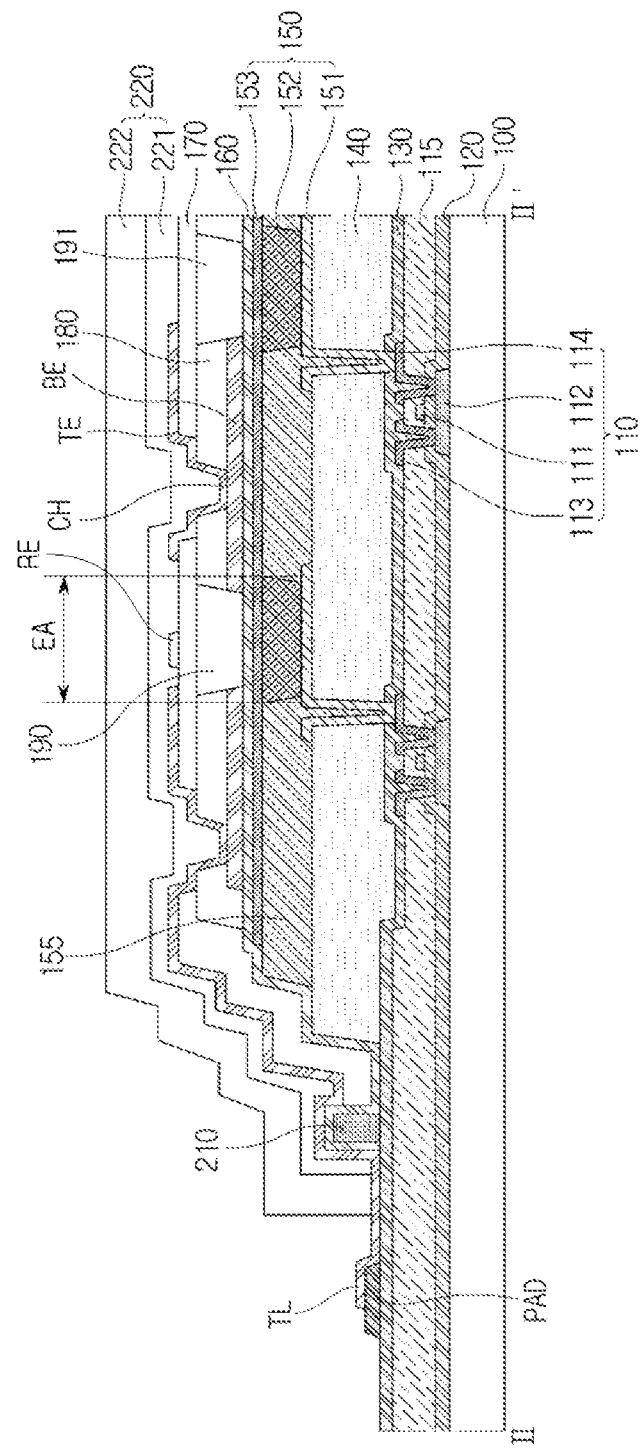
FIG. 6 is a pixel structure of the organic light emitting diode display device including the touch sensor according to some other exemplary embodiments of the present disclosure, shown by cutting along line II-II' of FIG. 4.

FIG. 6 is a pixel structure of the organic light emitting diode display device including the touch sensor according to some other exemplary embodiments of the present disclosure, shown by cutting along the line II-II' of FIG. 4. Descriptions of points similar to those of the previous exemplary embodiment will be omitted or brief and descriptions will be focused on other different points.

Referring to FIG. 6, the exemplary embodiment, in which shapes of the first touch electrode TE and the bridge electrode BE are different from those of the display device described with reference to FIG. 5, is shown.

In the present exemplary embodiment, the bridge electrode BE can be extended on the first encapsulation film 160 to be in contact with the color filter 190. In addition, a part of the first touch electrode TE can be overlapped vertically with the color filter 190. Therefore, the bridge electrode BE and the part of the first touch electrode TE can be extended into the light emitting area EA.

As described above, the first touch electrode TE and the bridge electrode BE are disposed between the light emitting areas EA to function as the black matrix preventing color mixing between the sub-pixels. Accordingly, when the first touch electrode TE and the bridge electrode BE are extended into the light emitting area EA, the size of the black matrix between the color filters 190 and 191 is increased, and the color mixing between the sub-pixels can be prevented more effectively.

Figure 7:
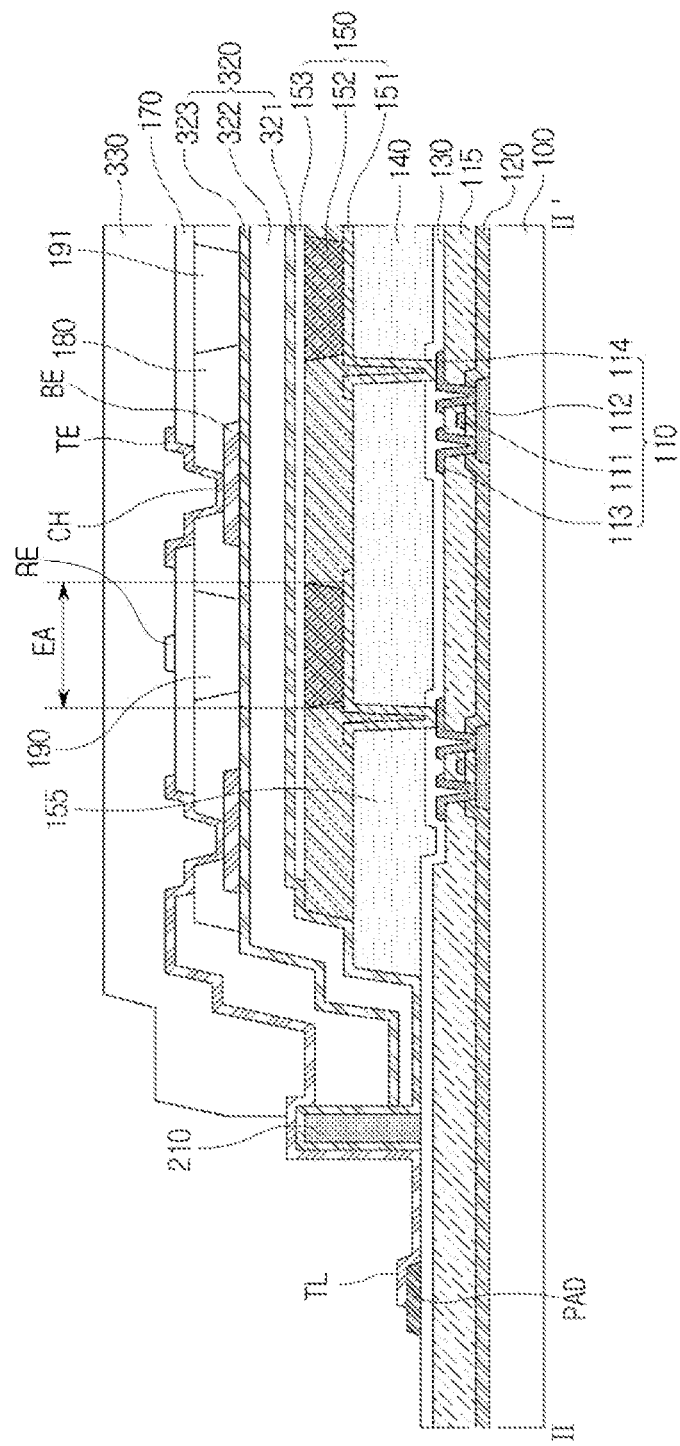
FIG. 7 is a pixel structure of the organic light emitting diode display including the touch sensor according to yet some other exemplary embodiments of the present disclosure shown by cutting along line II-II' of FIG. 4.

FIG. 7 is a pixel structure of the organic light emitting diode display including the touch sensor according to yet some other exemplary embodiments of the present disclosure shown by cutting along the line II-II' of FIG. 4.

Referring to FIG. 7, in the display device according to yet another exemplary embodiment of the present disclosure, the shapes of the first encapsulation film 320 and the second encapsulation film 330 are different from those of the above-described exemplary embodiment.

Specifically, the first encapsulation film 320 can include multi-layered films of a first inorganic film 321, an organic film 322, and a second inorganic film 323.

The first encapsulation film 320 can be formed on the second electrode 153. The first encapsulation film 320 can be extended to cover the side surfaces of the first bank insulating film 155 and the overcoat film 140, and to cover the upper surfaces of the passivation film 130 and the dam 210.

In the exemplary embodiment of FIG. 7, the first encapsulation film 320 includes a triple structure of the first inorganic film 321, the organic film 322, and the second inorganic film 323 so as to prevent oxygen or moisture from penetrating into the light emitting element 150. However, the present disclosure is not limited thereto, and the first encapsulation film 320 can have a structure of the multi-layered films in which two or more organic films are alternately stacked with the inorganic films.

Meanwhile, as the first encapsulation film 320 is formed on the light emitting element 150 through two or more inorganic films, the second encapsulation film 330 may not include an additional inorganic film. Therefore, the second encapsulation film 330 can have an overcoat structure surrounding the planarization film 170 and the underlying structure thereof.

In FIG. 7, the second encapsulation film 330 is shown as being extended to the dam 210, but the present disclosure is not limited thereto, and the second encapsulation film 330 can be formed to cover the pad PAD and the touch line TL connected thereto.

FIGS. 8 to 12 are intermediate step views for showing a manufacturing method of an organic light emitting diode device including a touch sensor according to some of the exemplary embodiments of the present disclosure, cut alone line II-II' of FIG. 4.

Figure 8:
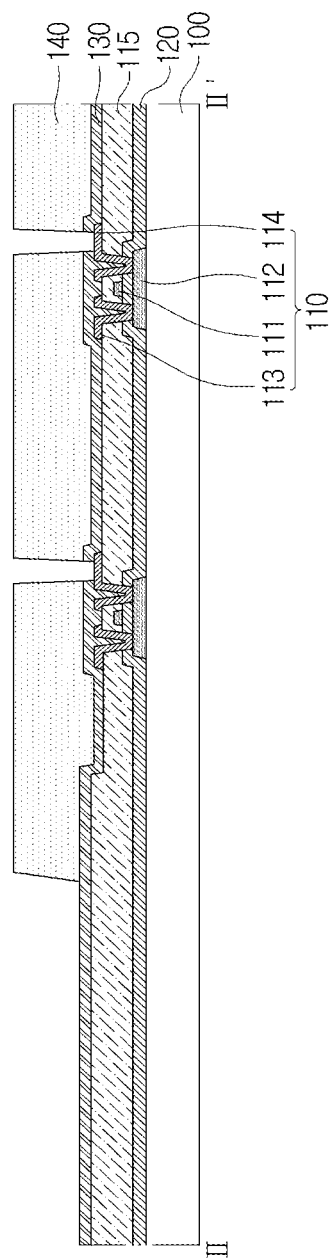
FIGS. 8 to 12 illustrate step views alone line II-II' of FIG. 4, for showing a manufacturing method of an organic light emitting diode display device including a touch sensor according to some of the exemplary embodiments of the present disclosure.

Referring to FIG. 8, a transistor 110, a passivation film 130, and an overcoat film 140 are sequentially formed on a substrate 100.

Specifically, an active pattern 112 is formed on the substrate 100, and p-type or n-type impurities are doped into the active pattern 112 to form a source area and a drain area, and a source electrode 113 and a drain electrode 114 can be respectively connected to the source area and the drain area.

A gate insulating film 120 can be formed on the active pattern 112. The gate insulating film 120 can be disposed on the gate electrode 111 and the active pattern 112. The gate electrode 111 and an interlayer insulating film 115 can be formed on the gate insulating film 120. The source electrode 113 and the drain electrode 114 can be provided to pass through the gate insulating film 120 and the interlayer insulating film 115, so as to be connected to the active pattern 112.

The overcoat film 140 can be formed to cover the passivation film 130. The overcoat film 140 can be formed by depositing, for example, an organic material and, in particular, can be formed by depositing and baking the organic material through spin coating or the like, but the present disclosure is not limited thereto.

Subsequently, a trench penetrating the overcoat film 140 is formed to expose the drain electrode 114.

Figure 9:
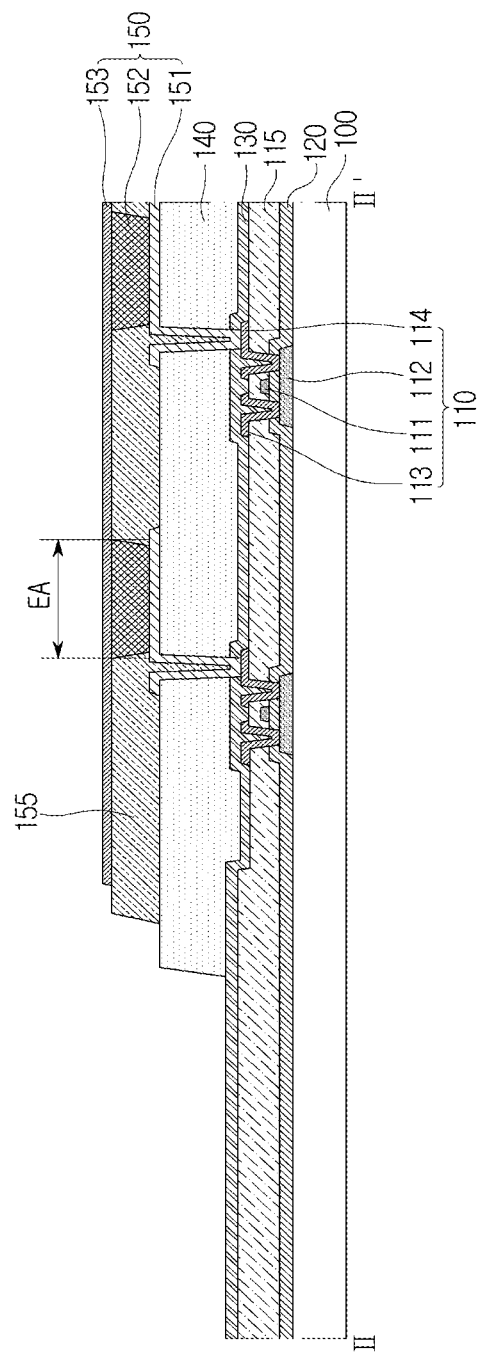

Referring to FIG. 9, the light emitting element 150 is provided on the overcoat film 140.

Providing the light emitting element can include: providing the first electrode 151 on the overcoat layer 140; forming the first bank insulating film 155 surrounding the light emitting area EA; and providing the light emitting layer 152 and the first electrode 153 in sequence.

Some of the exemplary embodiments of the present disclosure can include forming a part of the light emitting layer 152 by applying a light emitting material by the inkjet method, but the present disclosure is not limited thereto.

Figure 10:
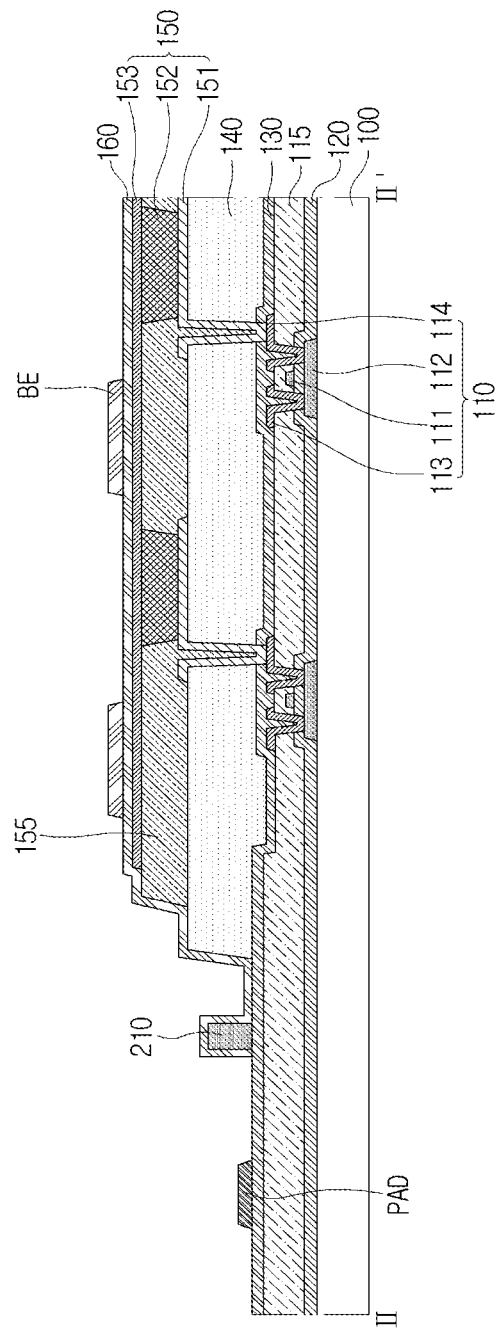

Referring to FIG. 10, a first encapsulation film 160 and a bridge electrode BE are sequentially provided on the second electrode 153. The first encapsulation film 160 can be extended to cover the side surfaces of the first bank insulating film 155 and the overcoat film 140, and to cover the upper surfaces of a passivation film 130 and a dam 210.

The first encapsulation film 160 can be formed, for example, by depositing at least one material of silicon nitride, aluminum nitride, zirconium nitride, titanium nitride, hafnium nitride, tantalum nitride, silicon oxide, aluminum oxide, and titanium oxide.

A bridge electrode BE is provided on the first encapsulation film 160. The bridge electrode BE can be provided between the light emitting area EA in which the light emitting element 150 is provided.

Figure 11:
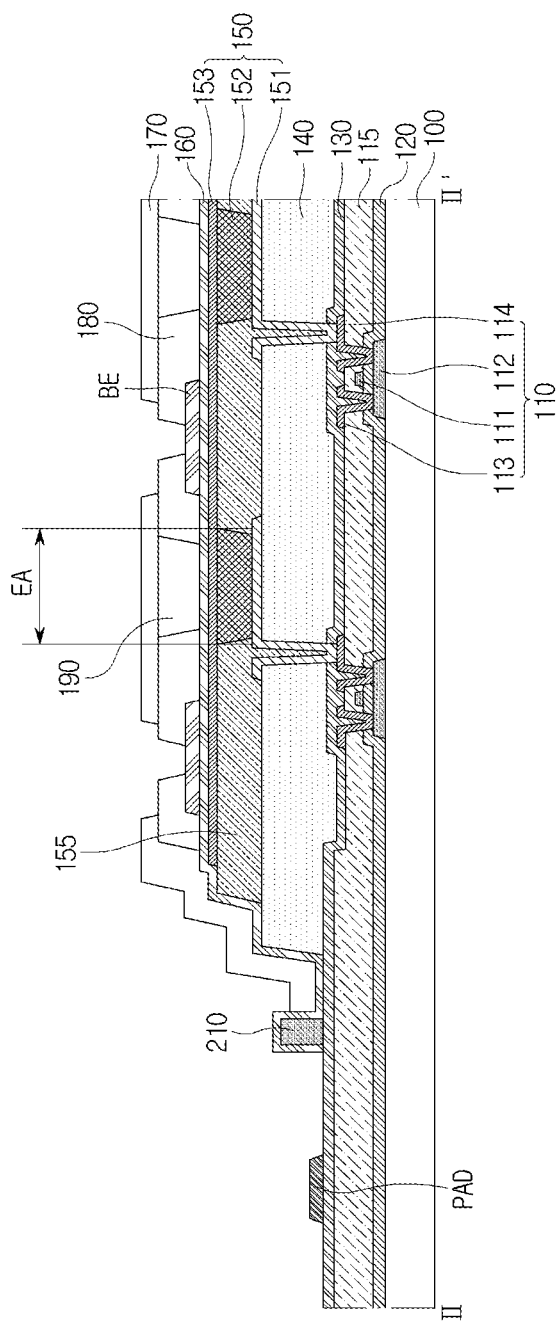

Referring to FIG. 11, a second bank insulating film 180 is formed on the bridge electrode BE. Forming of the second bank insulating film 180 can include depositing an organic material such as an acrylic resin, an epoxy resin, a phenolic resin, a polyamide resin, or a polyimide resin.

Thereafter, a part of the second bank insulating film 180 is removed to expose the upper surface of the first encapsulation film 160 and the upper surface of the bridge electrode BE, which are in the light emitting area EA.

Referring to still FIG. 11, a color filter 190 is formed in the light emitting area, and a planarization film 170 is formed to cover the color filter 190 and the second bank insulating film 180.

The color filter 190 can be formed by filling any one of red, green, or blue pigments in the trench defined by the second bank insulating film 180 of the light emitting area EA in the inkjet method and curing the pigment. Alternatively, when a white sub-pixel is to be provided, the trench can be filled with a transparent organic material by the inkjet method and then cured.

The planarization film 170 can also be formed by applying the transparent organic material on the color filter 190 and the second bank insulating film 180 by the inkjet method. The planarization film 170 can be blocked by the dam 210 so as to cover the side surfaces of the second bank insulating film 180 and the first encapsulation film 160 and not to reach the pad PAD.

Figure 12:
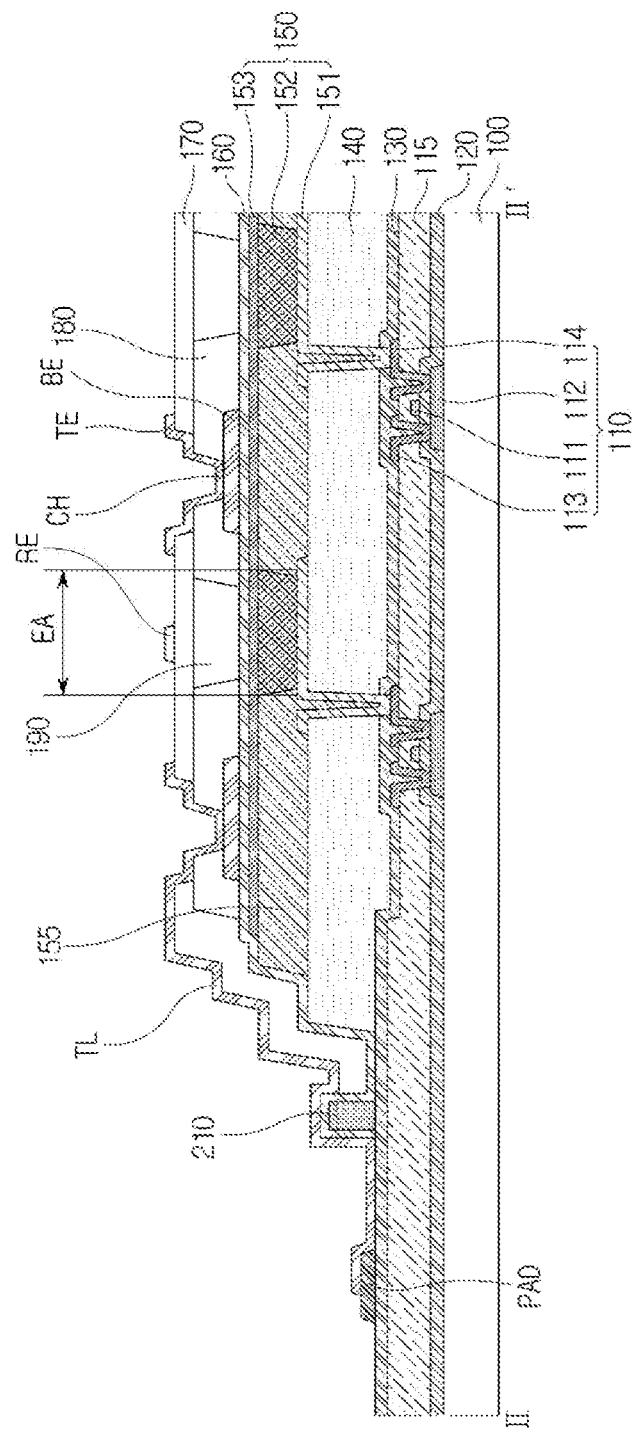

Referring still to FIG. 12, a first touch electrode TE and a contact hole CH are provided. In some of the exemplary embodiments of the present disclosure, the first touch electrode TE and the contact hole CH can be integrally provided. A metal material is deposited on the trench defined by the second bank insulating film 180 to form the contact hole CH, and by continuously depositing, a first touch electrode TE, covering the upper surface of the contact hole CH and protruding onto the planarization film 170, can be provided.

The first touch electrode TE is provided to be extended onto the side surface of the planarization film 170, and can form a touch line TL connected to the pad PAD. That is, the touch line TL and the first touch electrode TE can be integrally provided.

Subsequently, referring to FIG. 5 again, the second encapsulation film 220 can be formed to cover the first touch electrode TE and the planarization film 170.

It will be understood that those skilled in the art to which the present disclosure pertains can implement the present disclosure in other specific forms without departing from the technical spirit or essential features thereof. Therefore, the exemplary embodiments described above are to be understood in all respects as illustrative and not restrictive. The scope of the present disclosure is indicated by the following claims rather than the above detailed description, and all changes or modifications derived from the meaning and scope of the claims and equivalent concepts should be interpreted as being included in the claims of the present disclosure.

What is claimed is:

1. An organic light emitting diode display device including a touch sensor, the organic light emitting diode display device comprising:
   a substrate having a plurality of light emitting areas defined therein;
   a plurality of light emitting elements provided on the plurality of light emitting areas on the substrate;
   a first encapsulation film covering the plurality of light emitting elements;
   a plurality of color filters provided on the first encapsulation film to respectively correspond to the plurality of light emitting areas;
   a plurality of bridge electrodes provided between the plurality of color filters on the first encapsulation film;
   a bank insulating film provided on the first encapsulation film to cover the plurality of bridge electrodes and surround the plurality of color filters;
   a plurality of touch electrodes provided by being overlapped with the plurality of bridge electrodes on the bank insulating film;
   a planarization film covering the plurality of color filters and the bank insulating film and exposing the plurality of touch electrodes; and
   a contact penetrating the bank insulating film and connecting a touch electrode and a bridge electrode vertically overlapped with each other among the plurality of touch electrodes and bridge electrodes,
   wherein at least one of the plurality of touch electrodes is connected to a touch line provided along a side surface of the planarization film,
   wherein the bank insulating film includes a plurality of trenches exposing a portion of an upper surface of the first encapsulation film, corresponding to the plurality of light emitting areas,
   wherein the plurality of color filters are disposed in the plurality of trenches,
   wherein the plurality of trenches and the plurality of bridge electrodes and the plurality of color filters are disposed on a same plane,
   wherein a lowermost surface of each of the plurality of bridge electrodes directly contacts an uppermost surface of the first encapsulation film, a lowermost surface of the bank insulating film directly contacts the uppermost surface of the first encapsulation film, and a lowermost surface of each of the plurality of color filters directly contacts the uppermost surface of the first encapsulation film,
   wherein the plurality of bridge electrodes are disposed between the plurality of touch electrodes and the first encapsulation film, each of the plurality of bridge electrodes is disposed under a concave portion of a corresponding touch electrode among the plurality of touch electrodes and directly contacts a lower surface of the concave portion, and a point of contact between the concave portion of the corresponding touch electrode and a corresponding bridge electrode among the plurality of bridge electrodes is disposed in a corresponding trench in the bank insulating film between two adjacent color filters among the plurality of color filters, and
   wherein the bridge electrode and the touch electrode vertically overlapped with the bridge electrode and connected to the bridge electrode through the contact do not vertically overlap the plurality of the light emitting areas.

2. The organic light emitting diode display device of claim 1, wherein the contact and the touch electrode are integrally provided.

3. The organic light emitting diode display device of claim 1, wherein at least a part of the touch electrode protrudes onto the planarization film.

4. The organic light emitting diode display device of claim 1, wherein the part of the touch electrode is extended onto the planarization film so as to be vertically overlapped with the color filter.

5. The organic light emitting diode display device of claim 1, wherein the color filter and a part of the bridge electrode are in contact with each other.

6. The organic light emitting diode display device of claim 1, wherein the first encapsulation film includes:
a first inorganic film,
an organic film, and
a second inorganic film sequentially provided on the plurality of light emitting elements.

7. The organic light emitting diode display device of claim 1, wherein the concave portion of the corresponding touch electrode includes a stepped portion overlapping with one of the plurality of bridge electrodes, and
wherein the concave portion of the corresponding touch electrode includes an upper inclined surface portion contacting an inclined surface of the planarization film, and a lower inclined surface portion contacting an inclined surface of the bank insulating film.

8. The organic light emitting diode display device of claim 1, wherein the point of contact between the concave portion of the corresponding touch electrode and the corresponding bridge electrode is located between an upper surface of the first encapsulation layer and an upper surface of the bank insulating film.

9. The organic light emitting diode display device of claim 8, wherein the point of contact between the concave portion of the corresponding touch electrode and the corresponding bridge electrode is located closer to the upper surface of the first encapsulation layer than the upper surface of the bank insulating film.

10. The organic light emitting diode display device of claim 1, wherein the concave portion of the corresponding touch electrode is disposed in a first hole of the planarization film and a second hole in the bank insulating film, and
wherein the first hole of the planarization film is wider than the second hole in the bank insulating film.

11. The organic light emitting diode display device of claim 1, wherein the bridge electrode and the touch electrode vertically overlapped with the bridge electrode and connected to the bridge electrode through the contact are both disposed between the plurality of color filters on the first encapsulation film such that the bridge electrode and the touch electrode function as a black matrix.

12. A manufacturing method of an organic light emitting diode display device including a touch sensor, the manufacturing method comprising:
providing a plurality of light emitting elements in a plurality of light emitting areas on a substrate;
providing a first encapsulation film covering the plurality of light emitting elements;
providing a bridge electrode on the first encapsulation film;
providing a bank insulating film on the first encapsulation film, the bank insulating film exposing a part of the bridge electrode;
providing a plurality of color filters each on the first encapsulation film;
providing a planarization film to cover the plurality of color filters and the bank insulating film;
providing a touch electrode on the bank insulating film to be vertically overlapped with the bridge electrode; and
providing a second encapsulation film covering the touch electrode and the planarization film,
wherein the providing of the touch electrode includes providing a touch line together along a side surface of the planarization film,
wherein the providing of the bank insulating film on the first encapsulation film includes providing a plurality of trenches exposing a portion of an upper surface of the first encapsulation film, corresponding to the plurality of light emitting areas,
wherein the plurality of color filters are formed by filling the plurality of trenches with a pigment in an inkjet method and curing the pigment,
wherein a lowermost surface of each of the plurality of bridge electrodes directly contacts an uppermost surface of the first encapsulation film, a lowermost surface of the bank insulating film directly contacts the uppermost surface of the first encapsulation film, and a lowermost surface of each of the plurality of color filters directly contacts the uppermost surface of the first encapsulation film,
wherein the bridge electrode is disposed between the touch electrode and the first encapsulation film, the bridge electrode is disposed under a concave portion of the touch electrode and directly contacts a lower surface of the concave portion, and a point of contact between the concave portion of the corresponding touch electrode and a corresponding bridge electrode among the plurality of bridge electrodes is disposed in a corresponding trench in the bank insulating film between two adjacent color filters among the plurality of color filters,
wherein the providing of the touch electrode includes connecting the bridge electrode and the touch electrode to each other by providing a contact on the bridge electrode exposed by the bank insulating film and providing the touch electrode on the bank insulating film, and
wherein the bridge electrode and the touch electrode vertically overlapped with the bridge electrode and connected to the bridge electrode through the contact do not vertically overlap the plurality of the light emitting areas.

13. The manufacturing method of claim 12, wherein the contact and the touch electrode are integrally provided.

14. The manufacturing method of claim 12, wherein the providing of the planarization film includes applying a transparent organic material by an inkjet method so as to cover the bank insulating film and the color filter except an area where the touch electrode is provided.

15. The manufacturing method of claim 12, wherein the bridge electrode and the color filter are provided on a same plane.

16. The manufacturing method of claim 15, wherein the color filter and a part of the bridge electrode are in contact with each other.

17. The manufacturing method of claim 12, wherein the providing of the first encapsulation film includes sequentially providing a first inorganic film, an organic film, and a second inorganic film on the plurality of light emitting elements.

18. The manufacturing method of claim 12, wherein the concave portion of the touch electrode includes a stepped portion overlapping with the bridge electrode, and
wherein the concave portion of the touch electrode includes an upper inclined surface portion contacting an inclined surface of the planarization film, and a lower inclined surface portion contacting an inclined surface of the bank insulating film.

19. The manufacturing method of claim 12, wherein the point of contact between the concave portion of the corresponding touch electrode and the corresponding bridge electrode is located between an upper surface of the first encapsulation layer and an upper surface of the bank insulating film.

20. The manufacturing method of claim 12, wherein the bridge electrode and the touch electrode vertically overlapped with the bridge electrode and connected to the bridge electrode through the contact are both disposed between the plurality of color filters on the first encapsulation film such that the bridge electrode and the touch electrode function as a black matrix.

* * * * *